(12) United States Patent
Orino

(10) Patent No.: US 6,765,649 B2
(45) Date of Patent: Jul. 20, 2004

(54) EXPOSURE APPARATUS AND METHOD

(75) Inventor: Kanjo Orino, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 37 days.

(21) Appl. No.: 10/152,202

(22) Filed: May 21, 2002

(65) Prior Publication Data

US 2003/0020892 A1 Jan. 30, 2003

(30) Foreign Application Priority Data

May 22, 2001 (JP) ........................................ 2001-153136

(51) Int. Cl.[7] ........................... G03B 27/54; G03B 27/32
(52) U.S. Cl. ......................................... 355/67; 355/77
(58) Field of Search .......................... 355/35, 53, 67, 355/69, 71, 77

(56) References Cited

U.S. PATENT DOCUMENTS 5,726,739 A * 3/1998 Hayata ........................ 355/67
6,337,734 B1 * 1/2002 Mori ............................ 355/69
6,542,222 B1 * 4/2003 Tsuji et al. .................... 355/67
6,573,977 B1 * 6/2003 Mori ............................ 355/69
2001/0028448 A1 * 10/2001 Mori ............................ 355/55

* cited by examiner

*Primary Examiner*—Rodney Fuller
(74) *Attorney, Agent, or Firm*—Morgan & Finnegan, L.L.P.

(57) ABSTRACT

An exposure apparatus includes a condensing optical system for condensing light from a light source to a specified plane, an imaging optical system for imaging the light in the specified plane onto a reticle or a mask or near the reticle or mask, a projection optical system for projecting a pattern on the reticle or the mask onto an object to be exposed; and a beam splitting member that is provided between the condensing optical system and the specified plane, and generates a split beam, wherein $18.3° \leq \theta \leq 36.4°$, $1.0 \leq |B| \leq 2.5$ and $0.16 \leq NA2 \leq 0.23$ are met where $\theta$ is an angle formed between a splitting plane in the beam splitting member and a plane perpendicular to an optical axis, B is the magnification of the imaging optical system, and NA2 is a maximum numerical aperture on a light exit side of the imaging optical system.

12 Claims, 6 Drawing Sheets

ANGLE OF INCIDENCE TO NORMAL OF PLANE OF INCIDENCE 152 [DEG]

ANGLE OF INCIDENCE TO NORMAL OF PLANE OF INCIDENCE 152 [DEG]

EXPOSURE APPARATUS AND METHOD

BACKGROUND OF THE INVENTION

The present invention relates generally to exposure apparatuses, and more particularly to an exposure apparatus used to expose an object such as single crystal plates for semiconductor wafers, glass plates for liquid crystal displays (LCDs), and the like. The present invention is suitably applicable, for example, to an exposure apparatus for exposing single crystal plates for semiconductor wafers in a step-and-scan projection manner in a photolithography process.

The step-and-scan manner, as used herein, is one mode of projection exposure method which exposes a mask pattern onto a wafer by continuously scanning the wafer relative to the mask or a reticle (which are used interchangeably in the present application), and by moving, after a shot of exposure, the wafer stepwise to the next exposure area to be shot.

Along with the recent demands on smaller and lower profile electronic devices, minute semiconductor devices to be mounted onto these electronic devices have been increasingly required. For example, a design rule for a mask pattern requires that an image with a size of a line and space (L&S) of 0.1 $\mu$m or less be extensively formed and, presumably, it will further move to a formation of circuit patterns of 80 nm or less in the future. L&S denotes an image projected to a wafer in exposure with equal line and space widths, and serves as an index of exposure resolution.

A projection exposure apparatus, which is a typical exposure apparatus for fabricating semiconductor devices, generally includes an illumination apparatus that includes a light source, such as a laser, and an illumination optical system for illuminating a mask, and a projection optical system that is located between the mask and an object to be exposed. In order to provide a uniformly illuminated area, the illumination optical system introduces a beam from a laser to an optical integrator, such as a fly-eye integrator, to use multiple light sources created at and around the optical integrator's light exit plane as a secondary light source to illuminate a mask plane via a condenser lens. More specifically, referring to FIG. 9, an optical integrator 130A uniformly illuminates, via a condenser lens 140A, a masking blade 160A for restricting an exposure area to be scanned. The beam that has passed through the masking blade 160A illuminates the illuminated plane of the mask through an image-forming lens (not shown). Here, FIG. 9 is an enlarged side view showing part of a conventional illumination apparatus 100A. This structure arranges an exposure plane on the wafer, a pattern plane on the mask, and a plane of the masking blade 160A in a conjugate relationship.

In such an exposure apparatus, the image quality of a pattern to be transferred onto the wafer and the like depends deeply upon illumination performance, e.g., illumination distributions on the mask and wafer planes. Therefore, precise light amount control (i.e., illuminance control) is required to provide high quality semiconductor wafers, LCDs, thin-film magnetic heads, etc. Such light amount control uses a beam splitting member (e.g., a beam splitter half mirror) 150A and the like to split the condensed beam subsequent to the condenser lens 140A, and a sensor 182A to receive it for feedback control over an amount of the light from the light source (or a laser output) so that the illuminance of an illuminated area may fluctuate within a permissible range. In such an illumination apparatus, the sensor 182A detects the light amount of the exposure beam while arranging its light receiving surface at a position corresponding to mask's pattern plane.

However, there has recently been found a problem that an illumination apparatus that uses a half mirror distorts a beam intensity distribution, and causes distortion in an effective light source. As a result, an exposure apparatus using such an illumination apparatus deteriorates image quality on a wafer plane, deteriorating quality of devices to be provided.

As shown in FIG. 9, the half mirror 150A is arranged while somewhat inclined to a plane perpendicular to an optical axis OA so that a light-receiving element 182 for receiving a reflected beam may not obstruct exposure light. Therefore, it is understood that beams L1 and L2 that provide the maximum aperture (which beams L1 and L2 are referred to as an upper line L1 and a lower line L2 of the maximum aperture ray hereinafter in this application) make the largest difference in angle of incidence upon the half mirror among condensed beams incident upon the plane of incidence of the half mirror 150A.

Here, if it is assumed that the half mirror 150A is made of quartz (having an refractive index of 1.56 to a wavelength of 193 nm) and keeps its light receiving surface uncoated, the angular dependency of its spectral reflectance is as shown in FIG. 10. Here, FIG. 10 is a graph showing the spectral reflectance at the plane of incidence of the half mirror 150A. Thus, if the half mirror 150A's plane of incidence is not set to be optimally inclined against the plane perpendicular to the optical axis OA by taking into consideration numerical apertures (NAs) of the preceding and following optical systems, the beam reflected from the half mirror 150A would include a distorted intensity distribution. This would also cause a distorted intensity distribution in a transmitting beam through the half mirror 150A, providing a distortion in an effective light source, and finally deteriorated image quality on the wafer.

BRIEF SUMMARY OF THE INVENTION

Accordingly, it is an exemplary object of the present invention to provide an exposure apparatus and method that may reduce or eliminate a distortion in the intensity distribution of illumination light when a beam splitting member is provided on an illumination optical path.

All exposure apparatus of one aspect of the present invention includes a condensing optical system for condensing light from a light source to a specified plane, an imaging optical system for imaging the light in the specified plane onto a reticle or a mask or near the reticle or mask, a projection optical system for projecting a pattern on the reticle or the mask onto an object to be exposed, and a beam splitting member that is provided between the condensing optical system and the specified plane, and generates a split beam, wherein $18.3° \leq \theta \leq 36.4°$, $1.0 \leq |B| \leq 2.5$ and $0.16 \leq NA2 \leq 0.23$ are met where $\theta$ is an angle formed between a splitting plane in the beam splitting member and a plane perpendicular to an optical axis, B is the magnification of the imaging optical system, and NA2 is a maximum numerical aperture at a light exit side of the imaging optical system. According to this exposure apparatus, the upper and lower lines of the maximum aperture ray among the beams entering the beam splitting member have a small difference in angle of incidence upon the beam splitting member. Thus, it becomes possible to reduce and eliminate a distortion in the intensity distribution of transmitting beams that have transmitted the beam splitting member. Preferably, in this exposure apparatus, the maximum numerical aperture NA3 at a light exit side of the projection optical system satisfies $0.74 \leq NA3 \leq 0.9$.

The exposure apparatus may further include a detector for detecting a light amount of the above split beam, and a controller for controlling a light amount of the light source based on the detection result of the detector. Such an exposure apparatus may detect the light amount of light for illuminating a target area, and provides feedback control over the light amount of the light source so that the target area may have illuminance within a specified range. The beam splitting member may have an uncoated reflection surface for reflecting an incident beam so as to generate the split beam. Such a beam splitting member would secure reflectance necessary for the reflection plane without particularly increasing a manufacturing cost.

Further, an exposure method as another aspect of the present invention includes the steps of adjusting, within the angle θ, an angle between a beam splitting plane in the beam splitting member in the above exposure apparatus and a plane perpendicular to the optical axis, and illuminating the reticle or the mask using the above exposure apparatus. In addition, the exposure method may further include the steps of detecting a light amount of the beam split by the beam splitting member, and controlling a light amount of the light source based on the result detected by the detecting step. Such an exposure method is an exposure method using the above exposure apparatus, thus performing the operations similar to the above exposure apparatus.

A device fabricating method as still another aspect of the present invention includes the steps of exposing the object by using the above-described exposure apparatus, and performing a specified process for the exposed object. Claims for the device fabricating method that exhibits operations similar to those of the above exposure apparatus cover devices as their intermediate products and finished products. Moreover, such devices include, e.g., semiconductor chips such as LSIs and VLSIs, CCDs, LCDs, magnetic sensors, thin-film magnetic heads, etc.

Other objects and further features of the present invention will become readily apparent from the following description of the embodiments with reference to accompanying drawings.

DETAILED DESCRIPTION OF THE PREFERRED EMBODIMENTS

Figure 1:
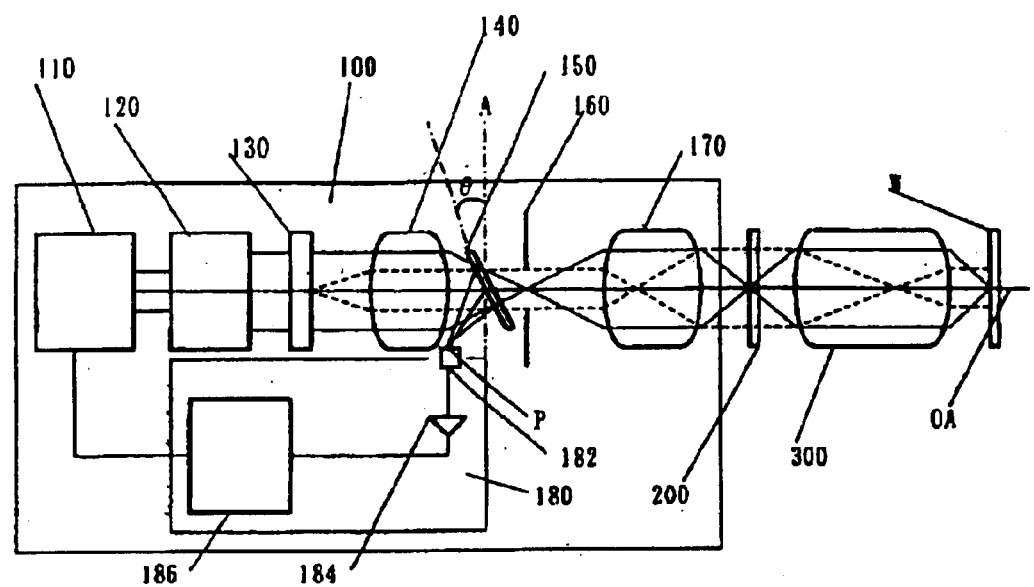
FIG. 1 is a schematic block diagram of an exemplary exposure apparatus of the present invention and an illumination apparatus as its part.
Figure 2:
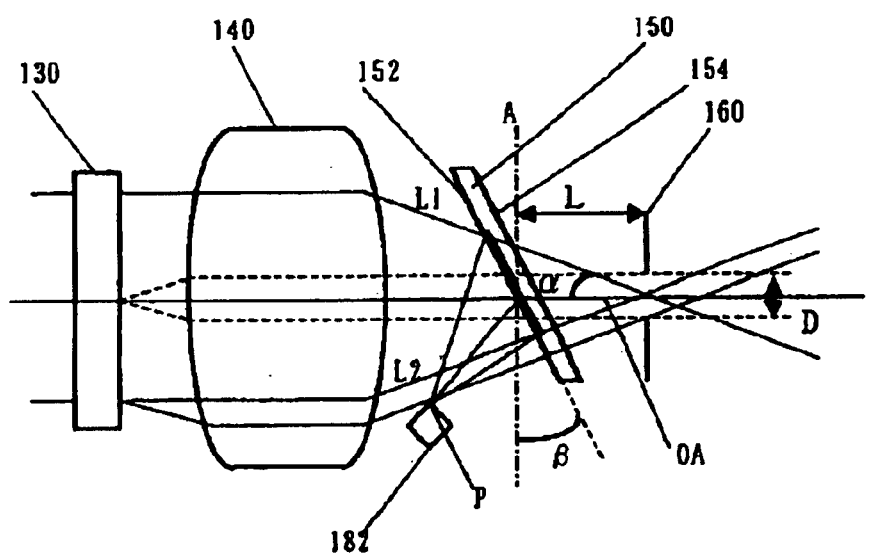
FIG. 2 is a partially enlarged side view around a beam splitting member in the exposure apparatus shown in FIG. 1.

A description will now be given of an exemplary exposure apparatus 1 and illumination apparatus 100 of the present invention with reference to accompanying drawings. The same reference numeral in each figure designates the same element. Here, FIG. 1 is a schematic block diagram of an exemplary exposure apparatus 1 of the present invention and the illumination apparatus 100 as its part. FIG. 2 is a partially enlarged side view around a beam splitting member 150 in the illumination apparatus 100 shown in FIG. 1.

As shown in FIG. 1, the exposure apparatus 1 includes the illumination apparatus 100, a mask 200, a projection optical system 300, and a controller (not shown). The exposure apparatus 1 is a scanning projection exposure apparatus for projecting a pattern formed on the mask 200 onto a plate W in a step-and-scan manner.

The inventive illumination apparatus 100 includes a light source part, an illumination optical system, and a light amount controller (i.e. exposure amount controller), thus illuminating the mask 200 on which a pattern to be transferred is created.

The light source part includes a laser 110 and beam shaping system 120, and serves as a light source for illuminating the illumination optical system.

The laser 110 is a light source that emits illumination light and uses an $F_2$ excimer laser of a wavelength of about 157 nm in the present embodiment, but it may be replaced with an ArF excimer laser with a wavelength of about 193 nm. Moreover, the light source can be, for example, an ultra-high pressure mercury lamp (g-line with a wavelength of about 436 nm or i-line with a wavelength of about 365 nm), or a xenon lamp generally having an output of 500W or higher.

The beam shaping system 120 may use, for example, a beam expander having a plurality of cylindrical lenses etc. and converts an aspect ratio of a size of a sectional shape of collimated light from the laser 110 into a desired value (for example, by changing the sectional shape from a rectangle to a square), thus shaping the beam shape to a desired one.

Preferably, the light source part uses an incoherently turning optical system, though it is not shown in FIG. 1, which turns a coherent laser beam into an incoherent one. The incoherently turning optical system may use an optical system that includes at least one return system, for example, as disclosed in FIG. 1 in Japanese Laid-Open Patent Application No. 3-215930, which splits an incident beam on a beam splitting plane into at least two beams (e.g., p polarized light and s polarized light). The return system then provides one of them, relative to the other, with an optical path length difference more than the coherence length of a laser beam via an optical member, and subsequently leads it to the light splitting plane so that the superimposed light is emitted.

The illumination optical system is an optical system for illuminating the mask 200 using a beam emitted from a laser 110, and includes an optical integrator 130, a condenser lens 140, a beam splitting member (or a half mirror) a masking blade 160, and an image-forming lens 170. The illumination optical system may use a condensing optical system, although not shown in FIG. 1, between the light source and the optical integrator 130. The condensing optical system includes a necessary deflecting mirror(s) and lens(es), and efficiently introduces a beam that has passed through them into the optical integrator 130. For example, the condensing optical system includes a condenser lens that is arranged such that a light exit side of the beam shaping system 120 and a plane of incidence of the optical integrator 130 as a fly-eye lens, which will be described later, are in an optical relationship between an object plane and a pupil plane (or a pupil plane and an image plane) (which relationship is sometimes called a Fourier transformation relationship in this application), whereby a principal ray of a beam that has passed the lens may be maintained to be parallel to any of lens elements in and around the center in the optical integrator 130.

The optical integrator 130 uniformizes illumination light for illuminating the mask 200, and is structured, for example, as a fly-eye lens, which converts an angular distribution of incident light to a positional distribution, and emits the light. The fly-eye lens' light incidence plane (surface) and light exit plane (surface) are optically in a relationship of an object plane and a pupil plane (or a pupil plane and an image plane), forming a plurality of point light sources which consists of a secondary light source (or an effective light source) at and around the light exit side.

The fly-eye lens arranges a plurality of lenses (or lens elements), each of which has the other plane with a different focus. When a sectional shape of each lens element in the fly-eye lens is approximately similar to the illuminated area, the fly-eye lens may provide higher light utilization efficiency for the illumination light, where each lens element has a spherical lens surface. This is because the fly-eye lens and the illuminated area are in the relationship of an object and an image.

The optical integrator 130 usable for the present invention is not limited to the fly-eye lens. For example, it may use multiple sets of cylindrical lens arrays that are arranged such that generating lines of cylindrical lenses in each set are orthogonal to one another. The fly-eye lens may be replaced with an optical rod. The optical rod uniformizes at its light exit plane a light intensity distribution that is not uniform at the light incidence plane, and has a rectangular section with an approximately same aspect ratio as the illuminated area with respect to a section perpendicular to a rod axis (or optical axis). When the optical rod has power with respect to the section perpendicular to the rod axis, the illuminance at the light exit plane does not become uniform, and thus the sectional shape perpendicular to the rod axis is a polygon formed only by straight lines. In addition, the fly-eye lens may be replaced with a diffractive element exhibiting a diffraction behavior.

An aperture stop (or a σ stop) having a variable shape and diameter may be provided just behind the light exit plane of the optical integrator 130. The aperture stop has, for example, a circular aperture. Alternatively, the aperture stop may be structured, for example, as an annular or quadrupole aperture stop. Such an aperture stop is effective as modified illumination (i.e., oblique incidence illumination) that increases the depth of focus around the resolution limit when it exposes a pattern on the mask 200. Preferably, a control mechanism (not shown) (for example, to a controller (not shown) of the exposure apparatus 1) is connected to the aperture stop to vary the diameter and the shape of the aperture stop.

The condensing lens 140 condenses as many effective light sources formed at and near the light exit surface of the fly-eye lens 130 as possible, superimposes them on the masking blade 160, and Koehler-illuminates the masking blade 160.

The beam splitting member 150 introduces a reflected beam to a sensor 182 in the light amount controller 180. The beam splitting member 150 is, for example, a half mirror (both will be used interchangeably hereinafter), and inclined at a specified angle θ to the light source side with respect to a plane A perpendicular to the optical axis OA. The half mirror 150 in this embodiment reduces the angle θ as much as possible between the incidence plane 152 and the plane perpendicular to the optical axis OA, in order to reduce a difference in reflectance between the upper and lower lines (rays) L1 and L2 of the incident ray upon the incidence plane 152. To be more specific, the half mirror 150 is characterized in that the angle θ satisfies $18.3° \leq \theta \leq 36.4°$. The angle θ at which the half mirror 150 is set will be readily apparent in the following embodiment.

Figure 3:
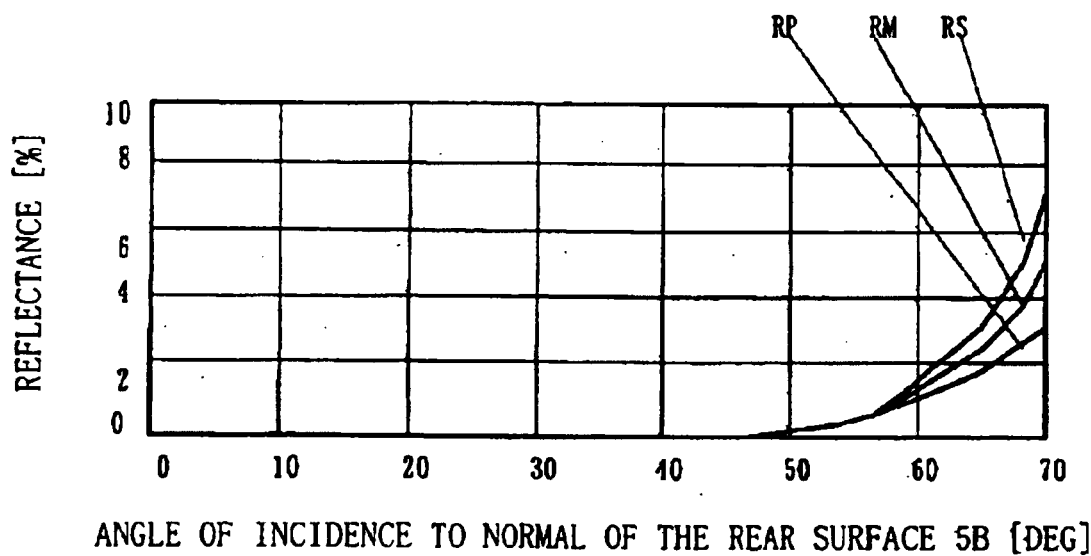
FIG. 3 is a graph showing the angular dependency of spectral reflectance on a rear surface of the half mirror shown in FIG. 1.

The half mirror 150 typically has a plane of incidence surface 152 and its rear surface 154 opposed to the incidence surface 152 with its thickness in between. The instant embodiment keeps the incidence surface 152 uncoated, while providing the rear surface 154 with common anti-reflection coating. Referring to FIG. 3, the common anti-reflection coating has low reflectance when the angle of incidence of ray to the normal of the rear surface 154 is within the range from 0° to 60 several degrees; in particular, it is extremely low reflectance within a range from 0° to 40 several degrees. Here, FIG. 3 is a graph showing the angular dependency of the spectral reflectance on the rear surface 154 of the half mirror 150. Therefore, the common anti-reflection coating can be used for the purpose of anti-reflection, but not as a reflection plane to detect illuminance. Therefore, the instant embodiment maintains the incidence plane 152 uncoated, in order to secure reflectance necessary for a reflection plane for detecting illuminance without particularly increasing manufacturing costs.

The half mirror 150 may use any technique known in the art, and thus a detailed description thereof will be omitted. The angle θ of the half mirror 150 may be made adjustable manually, but the half mirror 150 may be connected to a drive unit (not shown) so that the angle θ may be adjusted according to illumination conditions and configurations of the exposure apparatus 1. The drive unit in such a structure is so controlled, for example, by the controller (not shown) of the exposure apparatus 1 as to adjust the specific angle θ of the half mirror 150.

The masking blade 160 restricts an illumination range on the plane of the mask 200 (or an exposure range of the plate W) as a plane to be illuminated. The masking blade 160 includes, for example, four movable light blocking plates, forms an approximately rectangular aperture, and forms a rectangular illuminated area. In general, a step-and-scan type projection exposure apparatus is adapted such that the lateral direction of the illuminated area is in line with the scan direction.

The image-forming lens 170 is, for example, a condenser lens, and forms an image from the aperture shape of the masking blade 160 under a specified image-forming magnification onto the mask 200 as a target plane.

The light amount controller 180 detects the light amount of the beam reflected on the half mirror 150, and controls an output of the laser 110 based on the detection result. Typically, the light amount controller 180 includes the sensor 182 and a control part 186. The sensor 182 and the control part 186 are electrically connected, and the control part 186 is also electrically connected with the laser 110.

The sensor 182 is a detector for detecting a light amount. The sensor 182 is arranged such that a plane of detection (not shown) is located at a condensing point P for the beam reflected by the half mirror. As mentioned above, the sensor 182 is electrically connected to the control part 186, and thus, such a light amount of the beam incident upon the plane of detection is converted into a digital signal, which is output to the control part 186. The sensor 182 can use any technique known in the art, and thus a detailed description of thereof will be omitted. As shown in FIG. 1, the sensor 182 may have an amplifier 184 between the sensor 182 and the control part 186. In such a structure, a signal produced by the sensor 182 is amplified and output to the control part 186, and thus even a minute change in the light amount would effectively cause a signal.

The control part 186 typically includes a CPU and a memory, controls and appropriately adjusts the output of the laser 110 based on the detected result of the sensor 182. The control part 186 in the light amount controller 180 may be functionally replaced with the controller (not shown) of the exposure apparatus 1, which will be described later. In that structure the control part 186 in the light amount controller 180 can be omitted.

The CPU includes any processors such as MPU or whatever the name may be, and controls operations of each component. The memory includes a ROM and RAM, and store firmware that determines a laser output in accordance with the detected light amount. The structure of the control part 186 in the light amount controller 180 is not limited to the above if it can perform the above functions, and may of course apply any technique known to those skilled in the art.

The mask 200 is, e.g., of quartz, on which a circuit pattern (or an image) to be transferred is created, and is supported and driven by a mask stage (not shown). Diffracted light through the mask 200 is projected through the projection optical system 300 onto the plate W. The plate W is a target to be exposed, onto which resist is applied. The mask 200 and the plate W are located in an optically conjugate relationship. The exposure apparatus 1 in this embodiment is a step-and-scan type exposure apparatus (namely, a scanner), and therefore scans the mask 200 and the object W to transfer the pattern on the mask 200 onto the object W.

The mask stage supports the mask 200, and is connected to a transport mechanism (not shown). The mask stage and the projection optical system 300 are installed on a stage/lens barrel stool supported via a damper, for example, to the base-frame placed on the floor. The mask stage can use any structure known in the art. The transport mechanism (not shown) is made up of a linear motor and the like, and drives the mask stage in a direction orthogonal to the optical axis, thus moving the mask 200. The exposure apparatus 1 scans the mask 200 and the plate W in a state synchronized by a control unit (not shown).

The projection optical system 300 forms an image onto the plate W from diffracted light that has passed through the pattern formed on the mask 200. The projection optical system 300 may use an optical system solely composed of a plurality of lens elements, an optical system comprised of a plurality of lens elements and at least one concave mirror (a catadioptric optical system), an optical system comprised of a plurality of lens elements and at least one diffractive optical element such as a kinoform, and a full mirror type optical system, and so on. Any necessary correction of the chromatic aberration may use a plurality of lens units made from glass materials having different dispersion values (Abbe values), or arrange a diffractive optical element such that it disperses in a direction opposite to that of the lens unit.

The plate W is a wafer in this embodiment, but it may include a liquid crystal plate and a wide range of other objects to be exposed. Photoresist is applied onto the plate W. A photoresist application step includes a pretreatment, an adhesion accelerator application treatment, a photo-resist application treatment, and a pre-bake treatment. The pretreatment includes cleaning, drying, etc. The adhesion accelerator application treatment is a surface reforming process so as to enhance the adhesion between the photoresist and a base (i.e., a process to increase the hydrophobicity by applying a surface active agent), through a coat or vaporous process using an organic film such as HMDS (Hexamethyldisilazane). The pre-bake treatment is a baking (or burning) step, softer than that after development, which removes the solvent.

The plate W is supported by a wafer stage (not shown). The wafer stage may use any structure known in the art, and thus a detailed description of its structure and operations will be omitted. For example, the wafer stage may use a linear motor to move the plate W in a direction orthogonal to the optical axis. The mask 200 and plate W are, for example, scanned synchronously, and the positions of the mask stage and wafer stage are monitored, for example, by a laser interferometer and the like, so that both are driven at a constant speed ratio. The wafer stage is installed on a stage surface plate supported on the floor and the like, for example, via a damper, and the mask stage and the projection optical system 300 are installed on a lens barrel surface plate (not shown) supported, for example, via a damper to the base-frame placed on the floor.

The wafer stage may move the plate W in the direction of the optical axis within a range of the depth of focus, thus adjusting the image-forming position of the plate W. The exposure apparatus 1 performs a number of exposure operations for the plate W disposed in different positions to the direction of the optical axis, thereby eliminating dispersions in the image-forming performance within the depth of focus. Such a feature may use any technique known in the art such as a rack (not shown) extensible in the direction Z, a pinion (not shown) connected to the wafer stage and mobile on the rack, a means for rotating the pinion and the like, and thus a detailed description thereof will be omitted.

A controller (not shown) typically includes a CPU and a memory, and controls the exposure apparatus 1. The controller is electrically connected to the illumination apparatus 100, the mask stage (not shown), and the wafer stage (not shown). In this embodiment, the controller appropriately changes and moves at least one optical element of the illumination apparatus 100, the mask stage, and the wafer stage in accordance to an exposure operation. The CPU may include any processors such as a MPU or whatever the name may be, and controls operations of each component. A memory includes a ROM and RAM, and stores firmware that operates the exposure apparatus 1. The structure of the controller in the exposure apparatus is not limited to the above if it can perform the above function, and may apply of course any technique known to those skilled in the art.

EXAMPLES

Example 1

Referring to FIGS. 1 and 2, a description will be given of the first example of the present invention. This example sets the numerical aperture NA1 at the light exit side of the condenser lens 140 to 0.185, the numerical aperture NA2 at the light exit side of the image-forming lens 170 to 0.185, and the projection magnification B to −1.0. The maximum numerical aperture NA3 at light exit side (image side) of the projection optical system 300 is set to 0.74, and the projection magnification B3 to −¼, i.e., −0.25.

This example attempts to reduce as much as possible the set angle θ for the incidence plane 152 to the plane perpendicular to the optical axis OA so as to reduce a difference in reflectance between the upper and lower lines of the ray incident upon the incidence plane 152.

In FIG. 2, it is assumed that L is a distance from a position at which the incidence plane 152 of the half mirror 150 intersects the optical axis OA to a position of the condensing point of the condenser lens 140, D is a slit width of the masking blade 160 in the scan direction (i.e., the lateral direction of the aperture), α is an angle that the maximum aperture ray of the condenser lens 140 makes with the optical axis OA, and β is an angle that the incidence plane 152 forms with the plane perpendicular to the optical axis OA. The condensing point P of the beam reflected by the incidence plane 152 is located on the maximum aperture ray farthest from the axis. Under such conditions, the following equation is met:

$$L \cdot \sin 2\beta = (L + L \cdot \cos 2\beta) \cdot \tan \alpha + D/2 \quad (1)$$

When the distance L from the position at which the incidence plane 152 intersects the optical axis OA to the position of the condensing point of the on-axis beam is set to 100 mm and the slit width D in the masking blade in the scan direction is set to 32.0 mm, the projection exposure apparatus has an irradiation slit width of 26 mm×8 mm at the wafer 10 side while preventing a mechanical interference between the masking blade and the half mirror 160. When this condition, i.e., L=100 mm and D=32.0 mm, is substituted in the equation (1), β becomes 15.3° as the equation is solved for β using the numerical substitution. In view of 5° as an idle angle for preventing the sensor 182 and the lens barrel of the optical system from interrupting the effective ray, the set angle θ is 20.3° between the incidence plane 152 and the plane perpendicular to the optical axis.

Figure 4:
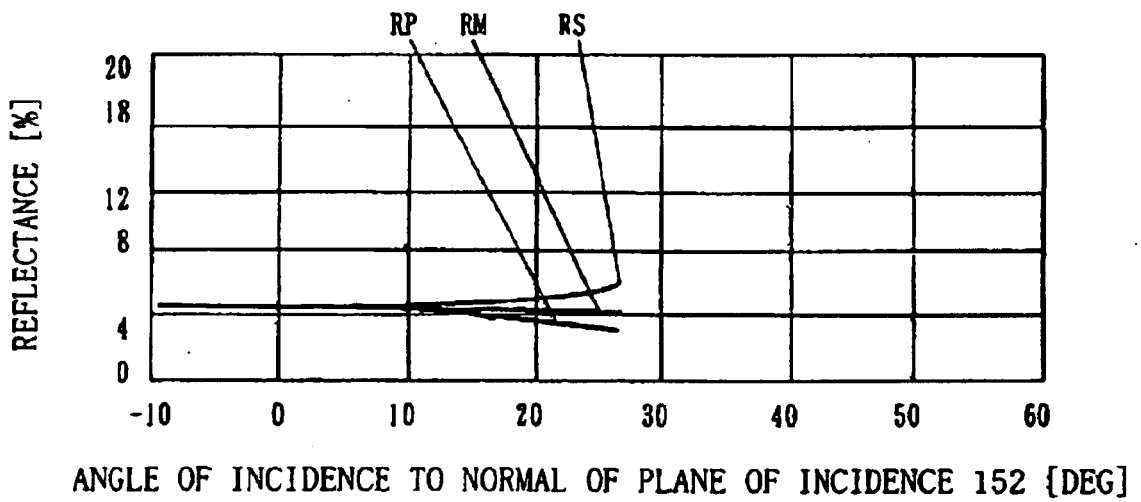
FIG. 4 is a graph showing the angular dependency of spectral reflectance of the half mirror shown in FIG. 1.

The above set maximum aperture makes the angle α to be 10.7° between the maximum aperture ray of the condenser lens 140 and the optical axis. Angles become 31.0° and −9.5° between each of the upper and lower lines L1 and L2 of the maximum aperture ray of the condenser lens 140 and the normal of the incidence plane 152. FIG. 4 shows the angular dependency of the spectral reflectance of the half mirror 150 at this time. Referring to FIG. 4, a difference in reflectance between the upper and lower lines L1 and L2 of the maximum aperture ray in the present embodiment is 0.2% when converted using a difference ΔRM as a difference of an average between an s-polarization (shown as RS in FIG. 4) and a p-polarization (shown as RP in FIG. 4).

From the relationship of the speed and non-uniform illuminance in scanning the slit in the masking blade 160, 32 mm would be the limit for the slit width in the scan direction in the present and future. Therefore, the set angle θ of the incidence plane 152 in this embodiment is the lower limit of the present invention. Since 2° is allowed for a set error and measurement error of the half mirror 150, 18.3° can be made the lower limit for the present invention.

Example 2

Referring now to FIGS. 1 and 2, a description will be given of the second example of the present invention. This example sets the numerical aperture NA1 at the light exit side of the condenser lens 140 to 0.2775, the numerical aperture NA2 at the light exit side of the image-forming lens 170 to 0.185, and the projection magnification B to −1.5. The maximum numerical aperture NA3 at the light exit side (image side) of the projection optical system 300 is set to 0.74, and the projection magnification B3 to −¼, i.e., −0.25.

Like the example 1, this example also attempts to reduce as much as possible the set angle θ between the incidence plane 152 and the plane perpendicular to the optical axis OA to reduce a difference in reflectance between the upper and lower lines of the ray incident upon the incidence plane 152.

When the distance L from the position at which the incidence plane 152 intersects the optical axis OA to the position of the condensing point of the on-axis beam is set to 100 mm and the slit width D in the masking blade in the scan direction is set to 21.3 mm, the projection exposure apparatus has an irradiation slit width of 26 mm×8 mm at the wafer 10 side while preventing a mechanical interference between the half mirror 150 and the masking blade 160. When this condition, i.e., L=100 mm and D=21.3 mm, is substituted in the equation 1, β becomes 19.2° as the equation is solved as to β using the numerical substitution. In view of 5° as an idle angle to prevent the sensor 182 and the lens barrel of the optical system from interrupting the effective ray, the set angle θ is set to 24.2° between the incidence plane 152 and the plane perpendicular to the optical axis.

The above set maximum numerical aperture makes the angle α to be 16.1° between the maximum aperture ray of the condenser lens 140 and the optical axis OA. Thus, angles become 40.3° and −8.1° between each of the upper and lower lines L1 and L2 in the maximum aperture ray between the condenser lens 140 and the normal of the incidence plane 152. The difference in reflectance between the upper and lower lines L1 and L2 of the maximum aperture ray in this embodiment is 0.6% when expressed using a difference ΔRM as a difference in average between an s-polarization and a p-polarization.

Example 3

Referring now to FIGS. 1 and 2, a description will be given of the third example of the present invention. This example sets the numerical aperture NA1 at the light exit side of the condenser lens 140 to 0.37, the numerical aperture NA2 at the light exit side of the image-forming lens 170 to 0.185, and the projection magnification B to −2.0. The maximum numerical aperture NA3 at the light exit side (image side) of the projection optical system 300 is set to 0.74, and the projection magnification B3 to −¼, i.e., −0.25.

Like the example 1, this example also attempts to reduce as much as possible the set angle θ between the incidence plane 152 and the plane perpendicular to the optical axis OA to reduce a difference in reflectance between the upper and lower lines of the ray incident upon the incidence plane 152.

When the distance L from the position at which the incidence plane 152 intersects the optical axis OA to the position of the condensing point of the on-axis beam is set to 100 mm and the slit width D in the masking blade in the scan direction is set to 16.0 mm, the projection exposure apparatus has an irradiation slit width of 26 mm×8 mm at the wafer 10 side while preventing a mechanical interference between the half mirror 150 and the masking blade 160. When this condition, i.e., L=100 mm and D=16.0 mm, is substituted in the equation 1, β becomes 24.0° as the equation is solved as to β using the numerical substitution. In view of 5° as an idle angle to prevent the sensor 182 and the lens barrel of the optical system from interrupting the effective ray, the set angle θ is set to 29.0° between the incidence plane (surface) 152 and the plane perpendicular to the optical axis.

The above set maximum numerical aperture makes the angle α to be 21.7° between the maximum aperture ray of the condenser lens 140 and the optical axis OA. Thus, angles become 50.7° and −7.3° between each of the upper and lower lines L1 and L2 in the maximum aperture ray of the condenser lens 140 and the normal of the incidence plane 152. The difference in reflectance of the upper and lower lines L1 and L2 of the maximum aperture ray in this embodiment is 1.9% when converted using a difference ΔRM as a difference of an average between an s-polarization and a p-polarization.

Example 4

Referring now to FIGS. 1 and 2, a description will be given of the fourth example of the present invention. This example sets the numerical aperture NA1 at the light exit side of the condenser lens 140 to 0.4625, the numerical aperture NA2 at the light exit side of the image-forming lens 170 to 0.185, and the projection magnification B to −2.5. The maximum numerical aperture NA3 at the light exit side (image side) of the projection optical system 300 is set to 0.74, and the projection magnification B3 to −¼, i.e., −0.25.

Like the example 1, this example also attempts to reduce as much as possible the set angle θ between the incidence plane 152 and the plane perpendicular to the optical axis OA to reduce a difference in reflectance between the upper and lower lines of the ray incident upon the incidence plane 152.

When the distance L from the position at which the incidence plane 152 intersects the optical axis OA to the position of the condensing point of the on-axis beam is set to 100 mm and the slit width D in the masking blade in the scan direction is set to 12.8 mm, the projection exposure apparatus has an irradiation slit width of 26 mm×8 mm at the wafer 10 side while preventing a mechanical interference between the half mirror 150 and the masking blade 160. When this condition, i.e., L=100 mm and D=12.8 mm, is substituted in the equation 1, β becomes 29.4° as the equation is solved as to β using the numerical substitution. In view of 5° as an idle angle to prevent the sensor 182 and the lens barrel of the optical system from interrupting the effective ray, the set angle θ is set to 34.4° between the incidence plane 152 and the plane perpendicular to the optical axis.

The above set maximum numerical aperture makes the angle α to be 27.5° between the maximum aperture ray of the condenser lens 140 and the optical axis OA. Thus, angles become 61.9° and −6.9° between each of the upper and lower lines L1 and L2 in the maximum aperture ray of the condenser lens 140 and the normal of the incidence plane 152. The difference in reflectance of the upper and lower lines L1 and L2 of the maximum aperture ray in this embodiment is 5.1% when converted using a difference ΔRM as a difference in an average between an s-polarization and a p-polarization.

Therefore, the set angle θ of the incidence plane 152 of this embodiment is the upper limit of the present invention. Since 2° is allowed as a setting error and measurement error, 36.4 can be made the upper limit of the present invention.

Example 5

Referring now to FIGS. 1 and 2, a description will be given of the fifth example of the present invention. This example sets the numerical aperture NA1 at the light exit side of the condenser lens 140 to 0.2, the numerical aperture NA2 at the light exit side of the image-forming lens 170 to 0.2, and the projection magnification B to −1.0. The maximum numerical aperture NA3 at the light exit side (image side) of the projection optical system 300 is set to 0.8, and the projection magnification B3 to −¼, i.e., −0.25.

Like the example 1, this example also attempts to reduce as much as possible the set angle θ between the incidence plane 152 and the plane perpendicular to the optical axis OA to reduce a difference in reflectance between the upper and lower lines of the ray incident upon the incidence plane 152.

When the distance L from the position at which the incidence plane 152 intersects the optical axis OA to the position of the condensing point of the on-axis beam is set to 100 mm and the slit width D in the masking blade in the scan direction is set to 32.0 mm, the projection exposure apparatus has an irradiation slit width of 26 mm×8 mm at the wafer 10 side while preventing a mechanical interference between the half mirror 150 and the masking blade 160. When this condition, i.e., L=100 mm, and D=32.0 mm, is substituted in the equation 1, β becomes 16.2° as the equation is solved as to β using the numerical substitution. In view of 5° as an idle angle to prevent the sensor 182 and the lens barrel of the optical system from interrupting the effective ray, the set angle θ is set to 21.2° between the incidence plane 152 and the plane perpendicular to the optical axis.

Figure 5:
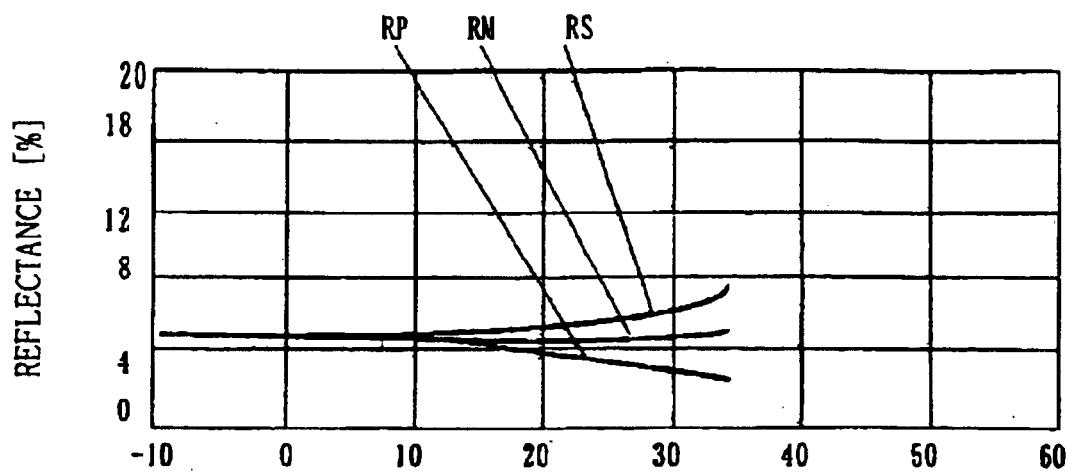
FIG. 5 is a graph showing the angular dependency of spectral reflectance of the half mirror shown in FIG. 1.

The above set maximum numerical aperture makes the angle α to be 11.5° between the maximum aperture ray of the condenser lens 140 and the optical axis OA. Thus, angles become 32.7° and −9.7° between each of the upper and lower lines L1 and L2 in the maximum aperture ray of the condenser lens 140 and the normal of the incidence plane 152. FIG. 5 shows the angular dependency of the spectral reflectance of the half mirror 150 at this time. Referring to FIG. 5, a difference in reflectance between the upper and lower lines L1 and L2 of the maximum aperture ray in the present embodiment is 0.2% when converted using a difference ΔRM as a difference of an average between an s-polarization and a p-polarization.

Example 6

Referring now to FIGS. 1 and 2, a description will be given of the sixth example of the present invention. This embodiment sets the numerical aperture NA1 at the light exit side of the condenser lens 140 to 0.3, the numerical aperture NA2 at the light exit side of the image-forming lens 170 to 0.2, and the projection magnification B to −1.5. The maximum numerical aperture NA3 at the light exit (image side) of the projection optical system 300 is set to 0.8, and the projection magnification B3 to −¼, i.e., −0.25.

Like the example 1, this example also attempts to reduce as much as possible the set angle θ between the incidence plane 152 and the plane perpendicular to the optical axis OA to reduce a difference in reflectance between the upper and lower lines of the ray incident upon the incidence plane 152.

When the distance L from the position at which the incidence plane 152 intersects the optical axis OA to the position of the condensing point of the on-axis beam is set to 100 mm and the slit width D in the masking blade in the scan direction is set to 21.3 mm, the projection exposure apparatus has an irradiation slit width of 26 mm×8 mm at the wafer 10 side while preventing a mechanical interference between the half mirror 150 and the masking blade 160. When this condition, L=100 mm and D=21.3 mm, is substituted in the equation 1, β becomes 20.7° as the equation is solved as to β using the numerical substitution. In view of 5° as an idle angle to prevent the sensor 182 and the lens barrel of the optical system from interrupting the effective ray, the set angle θ is set to 25.7° between the incidence plane 152 and the plane perpendicular to the optical axis.

The above set maximum numerical aperture makes the angle α to be 17.5° between the maximum aperture ray of the condenser lens 140 and the optical axis OA. Thus, angles become 43.2° and 8.2° between each of the upper and lower lines L1 and L2 in the maximum aperture ray of the condenser lens 140 and the normal of the incidence plane 152. A difference in reflectance between the upper and lower lines L1 and L2 of the maximum aperture ray in the present embodiment is 0.8% when converted using a difference ΔRM as a difference of an average between an s-polarization and a p-polarization component.

Example 7

Referring now to FIGS. 1 and 2, a description will be given of the seventh example of the present invention. This example sets the numerical aperture NA1 at the light exit side of the condenser lens 140 to 0.32, the numerical aperture NA2 at the light exit side of the image-forming lens 170 to 0.16, and the projection magnification B to −2.0. The maximum numerical aperture NA3 at the light exit side (image side) of the projection optical system 300 is set to 0.8, and the projection magnification B3 to −⅕, i.e., −0.2.

Like the example 1, this example also attempts to reduce as much as possible the set angle θ between the incidence plane 152 and the plane perpendicular to the optical axis OA to reduce a difference in reflectance between the upper and lower lines of the ray incident upon the incidence plane 152.

When the distance L from the position at which the incidence plane 152 intersects the optical axis OA to the position of the condensing point of the on-axis beam is set to 100 mm and the slit width D in the masking blade in the scan direction is set to 16.0 mm, the projection exposure apparatus has an irradiation slit width of 26 mm×8 mm at the wafer 10 side while preventing a mechanical interference between the half mirror 150 and the masking blade 160. When this condition, i.e., L=100 mm and D=16.0 mm, is substituted in the equation 1, β becomes 21.0° as the equation is solved as to β using the numerical substitution. In view of 5° as an idle angle to prevent the sensor 182 and the body lens barrel of the optical system from interrupting the effective ray, the set angle θ is set to 26.0° between the incidence plane 152 and the plane perpendicular to the optical axis.

The above set the maximum numerical aperture makes the angle α to be 18.7° between the maximum aperture ray of the condenser lens 140 and the optical axis OA. Thus, angles become 44.7° and −7.3° between each of the upper and lower lines L1 and L2 in the maximum aperture ray of the condenser lens 140 and the normal of the incidence plane 152. A difference in reflectance between the upper and lower lines L1 and L2 of the maximum aperture ray in the present embodiment is 1.1% when converted using a difference ΔRM as a difference of an average between an s-polarization and a p-polarization.

Example 8

Referring now to FIGS. 1 and 2, a description will be given of the eighth example of the present invention. This example sets the numerical aperture NA1 at the light exit side of the condenser lens 140 to 0.45, the numerical aperture NA2 at the light exit side of the image-forming lens 170 to 0.225, and the projection magnification B to −2.0. The maximum numerical aperture NA3 at the light exit side (image side) of the projection optical system 300 is set to 0.9, and the projection magnification B3 to −¼, i.e., −0.25.

Like the example 1, this example also attempts to reduce as much as possible the set angle θ between the incidence plane 152 and the plane perpendicular to the optical axis OA to reduce a difference in reflectance between the upper and lower lines of the ray incident upon the incidence plane 152.

When the distance L from the position at which the incidence plane 152 intersects the optical axis OA to the position of the condensing point of the on-axis beam is set to 100 mm and the slit width D in the masking blade in the scan direction is set to 16.0 mm, the projection exposure apparatus has an irradiation slit width of 26 mm×8 mm at the wafer 10 side while preventing a mechanical interference between the half mirror 150 and the masking blade 160. When this condition, i.e., L=100 mm and D=16.0 mm, is substituted in the equation 1, β becomes 29.0° as the equation is solved as to β using the numerical substitution. In view of 5° as an idle angle to prevent the sensor 182 and the lens barrel of the optical system from interrupting the effective ray, the set angle θ is set to 34.0° between the incidence plane 152 and the plane perpendicular to the optical axis.

Figure 6:
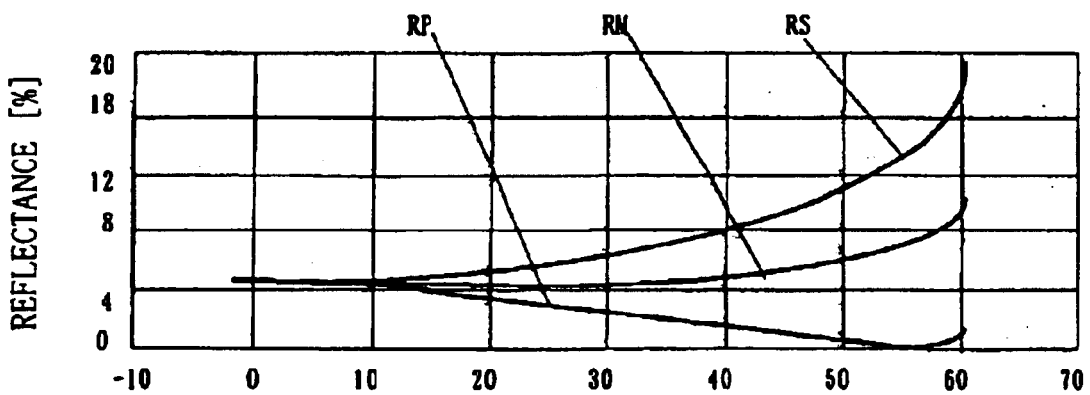
FIG. 6 is a graph showing the angular dependency of spectral reflectance of the half mirror shown in FIG. 1.

The above set maximum numerical aperture makes the angle α to be 26.7° between the maximum aperture ray (most upper ray or most lower ray) of the condenser lens 140 and the optical axis OA. Thus, angles become 60.7° and −7.3° between each of the upper and lower lines (rays) L1 and L2 in the maximum aperture ray of the condenser lens 140 and the normal of the incidence plane 152. FIG. 6 shows the angular dependency of the spectral reflectance of the half mirror 150 at this time. Referring to FIG. 6, a difference in reflectance between the upper and lower lines L1 and L2 of the maximum aperture ray in the present embodiment is 5.1% when converted using a difference ΔRM as a difference of an average between an s-polarization and a p-polarization.

Example 9

Referring now to FIGS. 1 and 2, a description will be given of the ninth example related to the present invention. This example sets the numerical aperture NA1 at the light exit side of the condenser lens 140 to 0.4, the numerical aperture NA2 at light exit side of the image-forming lens 170 to 0.16, and the projection magnification B to −2.5. The maximum numerical aperture NA3 at the light exit side (image side) of the projection optical system 300 is set to 0.8, and the projection magnification B3 to −¼, i.e., −0.25.

Like the example 1, this example also attempts to reduce as much as possible the set angle θ between the incidence plane 152 and the plane perpendicular to the optical axis OA to reduce a difference in reflectance between the upper and lower lines of the ray incident upon the incidence plane 152.

When the distance L from the position at which the incidence plane 152 intersects the optical axis OA to the position of the condensing point of the on-axis beam is set to 100 mm and the slit width D in the masking blade in the scan direction is set to 12.8 mm, the projection exposure apparatus has an irradiation slit width of 26 mm×8 mm at the wafer 10 side while preventing a mechanical interference between the half mirror 150 and the masking blade 160. When this condition, i.e., L=100 mm and D=12.8 mm, is substituted in the equation 1, β becomes 26.0° as the equation is solved as to β using the numerical substitution. In view of 5° as an idle angle to prevent the sensor 182 and the lens barrel of the optical system from interrupting the effective ray, the set angle θ is set to 31.0° between the incidence plane 152 and the plane perpendicular to the optical axis.

The above set maximum numerical aperture makes the angle α to be 23.6° between the maximum aperture ray of the condenser lens 140 and the optical axis OA. Thus, angles become 54.6° and −7.4° between each of the upper and lower lines L1 and L2 in the maximum aperture ray of the condenser lens 140 and the normal of the incidence plane 152. A difference in reflectance between the upper and lower lines L1 and L2 of the maximum aperture ray in the present embodiment is 3.1% when converted using a difference ΔRM as a difference of an average between an s-polarization and a p-polarization.

secondary light source illuminate the masking blade 160 uniformly via the condensing optical system 140. At this time, part of the beam is reflected by the half mirror 150, and condensed into the sensor 182.

The beams that have passed the masking blade 160 pass the image-forming lens 170, and then illuminate a plane of the mask 200.

The beams having passed the mask 200 are demagnified and projected under a specific magnification onto the object W due to the image-forming operation of the projection optical system 300. The exposure apparatus 1 of a step-and-scan type would fix the light source part and the projection optical system 300, and synchronously scan the mask 200 and object W, then exposing the entire shot. The wafer stage for the object W is stepped to the next shot, thus exposing and transferring a large number of shots on the object W.

The beam that has entered the above sensor 182 is converted into an electric signal corresponding to the light

TABLE 1 below summarizes the above values:

| Examples | 1 | 2 | 3 | 4 | 5 | 6 | 7 | 8 | 9 |
|---|---|---|---|---|---|---|---|---|---|
| NA1 | 0.185 | 0.2775 | 0.37 | 0.4625 | 0.2 | 0.3 | 0.32 | 0.45 | 0.4 |
| α (deg) | 10.7 | 16.1 | 21.7 | 27.5 | 21.5 | 17.5 | 18.7 | 26.7 | 23.6 |
| D (mm) | 32.0 | 21.3 | 16.0 | 12.8 | 32.0 | 21.3 | 16.0 | 16.0 | 12.8 |
| B | −1.0 | −1.5 | −2.0 | −2.5 | −1.0 | −1.5 | −2.0 | −2.0 | −2.5 |
| NA2 | 0.185 | 0.185 | 0.185 | 0.185 | 0.2 | 0.2 | 0.16 | 0.225 | 0.16 |
| B | −0.25 | −0.25 | −0.25 | −0.25 | −0.25 | −0.25 | −0.2 | −0.25 | −0.25 |
| NA3 | 0.74 | 0.74 | 0.74 | 0.74 | 0.8 | 0.8 | 0.8 | 0.9 | 0.8 |
| β (deg) | 15.3 | 19.2 | 24.0 | 29.4 | 16.2 | 20.7 | 21.0 | 29.0 | 26.0 |
| θ (deg) | 20.3 | 24.2 | 29.0 | 34.4 | 21.2 | 25.7 | 26.0 | 34.0 | 31.0 |
| ΔRM (%) | 0.2 | 0.6 | 1.9 | 5.1 | 0.2 | 0.8 | 1.1 | 5.1 | 3.1 |

The exposure apparatus 1 having the above factors exposes a pattern on the mask 200 onto the plate W in a demagnification manner, and may form an image under the exposure conditions of very little distorted light intensity within the maximum aperture ray. In other words, this is especially effective for the projection exposure apparatus that satisfies the following equations (2) to (4), where B is an image-forming magnification of the image-forming lens 170, NA2 is a maximum numerical aperture at the light exit side of the image-forming lens 170, and NA3 is a maximum numerical aperture at the light exit side (image side) of the projection optical system 300.

$$1.0 \leq |B| \leq 2.5 \quad (2)$$

$$0.16 \leq NA2 \leq 0.23 \quad (3)$$

$$0.74 \leq NA3 \leq 0.9 \quad (4)$$

A description will now be given below of exposure operations using the inventive exposure apparatus 1. As an initial procedure before the exposure operation, the half mirror 150 in the exposure apparatus 1 may be fixed at an effective position within a range of the angle θ, or may be adjusted, while driven by the drive unit (not shown), to an appropriate angle θ within the range of the angle θ according to illumination conditions (e.g., the aperture width D in the masking blade 160) or the numerical aperture of optical systems in the exposure apparatus 1. In exposure, a beam emitted from the laser 110 is reshaped into a desired beam shape by the beam shaping system 120, and then enter the optical integrator 130. Beams emitted from the optical integrator 130 are split into multiple partial beams, forming a secondary light source. The beams emitted from the amount of the beam, and sent to the controller 186. Based on the illuminance with which to illuminate the mask 200, the controller 186 feedback-controls the light amount of the laser 110 so that such the light amount fluctuates within a permissible range.

The inventive exposure apparatus 1 reduces a difference in angle of incidence upon the half mirror 150 between the upper and lower lines L1 and L2 of the maximum aperture ray among those incident upon the half mirror 150 and prevents a distorted intensity distribution of transmitting beams. Thus, the exposure apparatus 1 can improve the image quality. As a result, the exposure apparatus 1 can perform a pattern transfer to the resist with high precision, thus providing high quality devices (such as semiconductor devices, LCD devices, image pick-up devices (such as CCDs), thin film magnetic heads, and the like).

Figure 7:
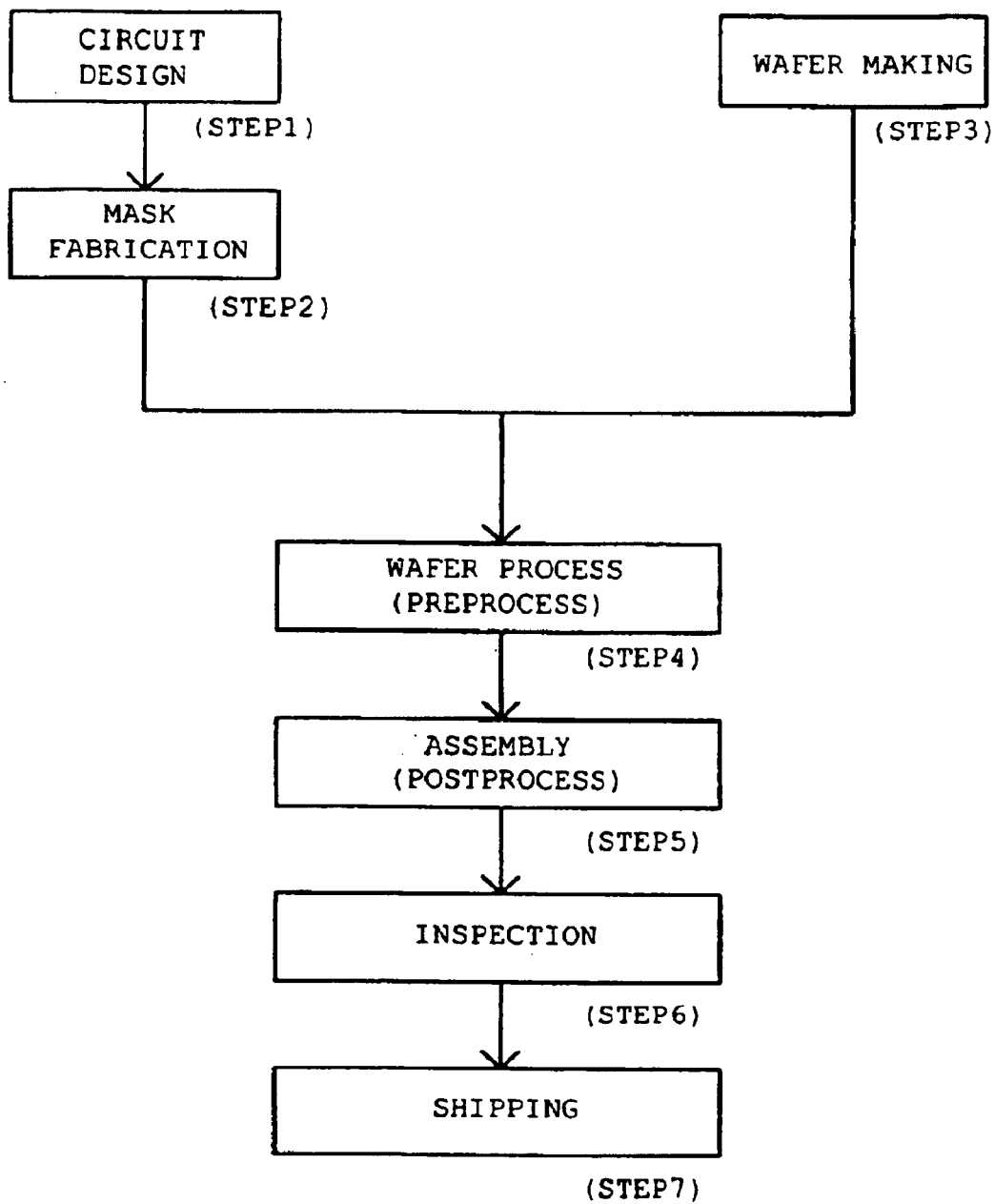
FIG. 7 is a flowchart for explaining a fabrication of devices (semiconductor chips such as ICs, LSIs, and the like, LCDs, CCDs, etc.).
Figure 8:
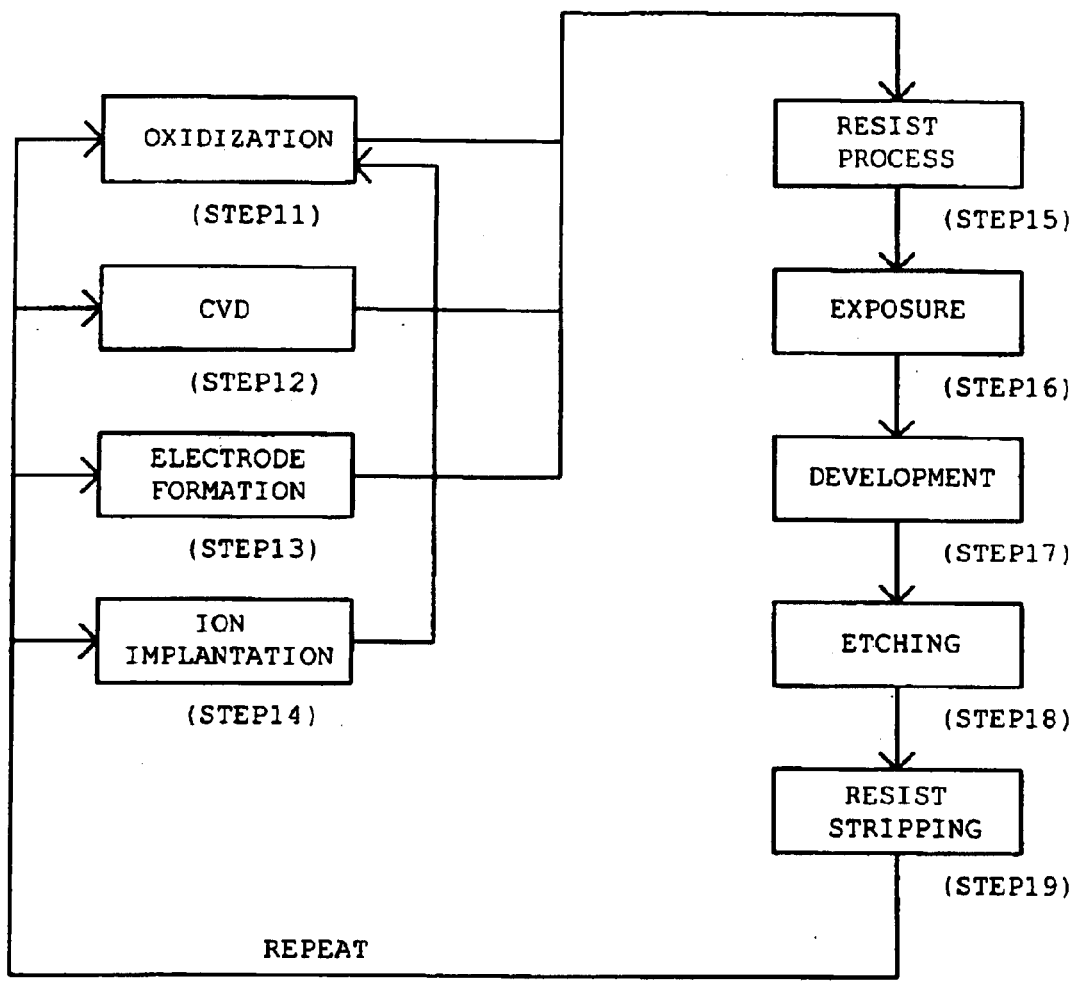
FIG. 8 is a detailed flowchart for Step 4 Wafer Process shown in FIG. 7.
Figure 9:
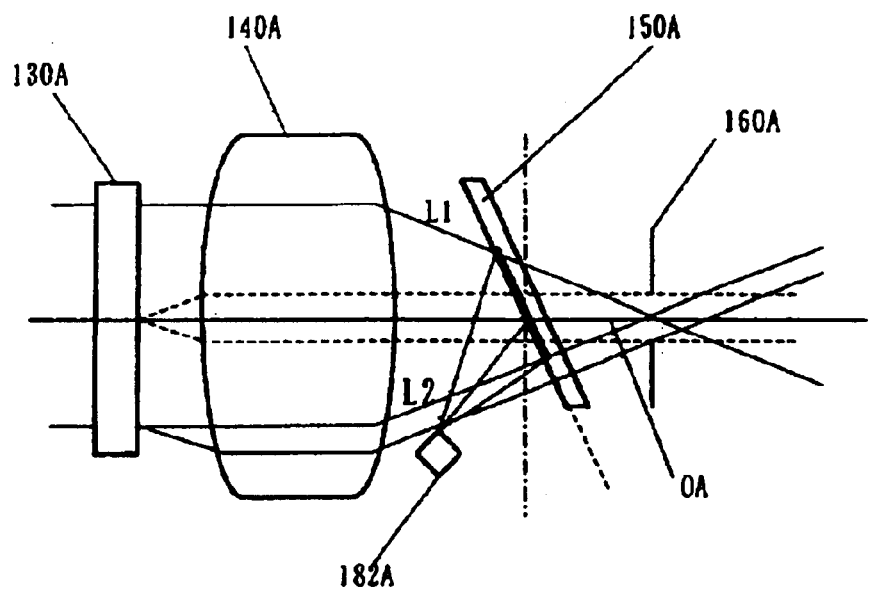
FIG. 9 is an enlarged side view showing part of a conventional illumination apparatus.
Figure 10:
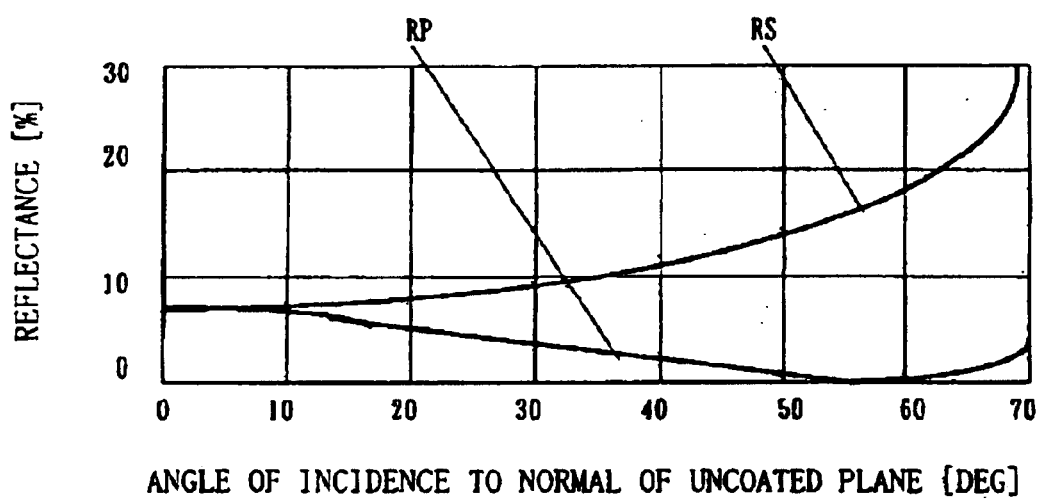
FIG. 10 is a graph showing spectral reflectance at a plane of incidence of a half mirror shown in FIG. 9.

Referring to FIGS. 7 and 8, a description will now be given of an embodiment of a device fabricating method using the above mentioned exposure apparatus 1. FIG. 7 is a flowchart for explaining how to fabricate devices (i.e., semiconductor chips such as IC and LSI, LCDs, CCDs, etc.). Here, a description will be given of the fabrication of a semiconductor chip as an example. Step 1 (circuit design) designs a semiconductor device circuit. Step 2 (mask fabrication) forms a mask having a designed circuit pattern. Step 3 (wafer making) manufactures a wafer using materials such as silicon. Step 4 (wafer process), which is also referred to as a pretreatment, forms actual circuitry on the wafer through photolithography of the present invention using the mask and wafer. Step 5 (assembly), which is also referred to as a posttreatment, forms into a semiconductor chip the wafer formed in Step 4 and includes an assembly step (e.g., dicing, bonding), a packaging step (chip sealing), and the like. Step 6 (inspection) performs various tests for the semiconductor device made in Step 5, such as a validity test and a durability test. Through these steps, a semiconductor device is finished and shipped (Step 7).

FIG. 8 is a detailed flowchart of the wafer process in Step 4. Step 11 (oxidation) oxidizes the wafer's surface. Step 12 (CVD) forms an insulating film on the wafer's surface. Step 13 (electrode formation) forms electrodes on the wafer by vapor disposition and the like. Step 14 (ion implantation) implants ion into the wafer. Step 15 (resist process) applies a photosensitive material onto the wafer. Step 16 (exposure) uses the exposure apparatus 1 to expose a circuit pattern on the mask onto the wafer. Step 17 (development) develops the exposed wafer. Step 18 (etching) etches parts other than a developed resist image. Step 19 (resist stripping) removes disused resist after etching. These steps are repeated, and multi-layer circuit patterns are formed on the wafer.

Further, the present invention is not limited to these preferred embodiments, and various modifications and changes may be made in the present invention without departing from the spirit and scope thereof.

According to the inventive exposure apparatus and method, the upper and lower lines in the maximum aperture ray have a small difference in angle of incidence upon the half mirror among those entering the half mirror, and reduce a distortion in the intensity distribution of transmitting beams. As a result, the exposure apparatus may improve the quality of an image formed on the plate. Thereby, the exposure apparatus may perform a pattern transfer to the resist with high precision, and provide high quality devices.

What is claimed is:

1. An exposure apparatus comprising:
   a condensing optical system for condensing light from a light source to a specified plane;
   an imaging optical system for imaging the light in the specified plane onto a reticle or a mask or near the reticle or mask;
   a projection optical system for projecting a pattern on the reticle or the mask onto an object to be exposed; and
   a beam splitting member that is provided between the condensing optical system and the specified plane, and generates a split beam, wherein $18.3° \leq \theta \leq 36.4°$, $1.0 \leq |B| \leq 2.5$ and $0.16 \leq NA2 \leq 0.23$ are met where $\theta$ is an angle formed between a splitting plane in the beam splitting member and a plane perpendicular to an optical axis, B is the magnification of the imaging optical system, and NA2 is a maximum numerical aperture on a light exit side of the imaging optical system.

2. An exposure apparatus according to claim 1, wherein $0.74 \leq NA3 \leq 0.9$ is met where NA3 is a maximum numerical aperture at a light exit side of the projection optical system.

3. An exposure apparatus according to claims 1, further comprising:
   a detector for detecting a light amount of the split beam; and
   a controller for controlling a light amount of the light source based on a detection result of the detector.

4. An exposure apparatus comprising:
   an optical system for radiating light from a light source onto an optical integrator;
   a condensing optical system for condensing light from the optical integrator to a specified plane;
   an imaging system for imaging the light in the specified plane onto a reticle or a mask or near the reticle or the mask;
   a projection optical system for projecting a pattern on the reticle or the mask onto an object to be exposed; and
   a beam splitting member that is provided between the condensing optical system and the specified plane and generates a split beam used as a detection beam for measuring illuminance on the object, wherein $18.3° \leq \theta \leq 36.4°$, $1.0 \leq |B| \leq 2.5$, $0.16 \leq NA2 \leq 0.23$ and $0.74 \leq NA3 \leq 0.9$ are met where $\theta$ is an angle formed between a beam splitting plane in the beam splitting member and a plane perpendicular to an optical axis, B is the magnification of the imaging optical system, NA2 is a maximum numerical aperture at a light exit side of the imaging optical system, and NA3 is a maximum numerical aperture at a light exit side of the projection optical system.

5. An exposure apparatus according to claims 4, further comprising:
   a detector for detecting a light amount of the split beam; and
   a controller for controlling a light amount of the light source based on a detection result of the detector.

6. An exposure apparatus according to claim 4, wherein the beam splitting member has an uncoated reflection surface for reflecting an incident beam so as to generate the split beam.

7. An exposure method using an exposure apparatus that comprises a condensing optical system for condensing light from a light source to a specified plane, an imaging optical system for imaging the light in the specified plane onto a reticle or a mask or near the reticle or mask, a projection optical system for projecting a pattern on the reticle or the mask onto an object to be exposed, and a beam splitting member that is provided between the condensing optical system and the specified plane, and generates a split beam, wherein $18.3° \leq \theta \leq 36.4°$, $1.0 \leq |B| \leq 2.5$ and $0.16 \leq NA2 \leq 0.23$ are met where G is a first angle formed between a splitting plane in the beam splitting member and a plane perpendicular to an optical axis, B is the magnification of the imaging optical system, and NA2 is a maximum numerical aperture at a light exit side of the imaging optical system, said method comprising the steps of:
   adjusting the first angle within the angle of $\theta$; and
   illuminating the reticle or the mask by using said exposure apparatus.

8. An exposure method according to claim 7, further comprising the steps of:
   detecting a light amount of the beam split by the beam splitting member; and
   controlling a light amount of the light source based on a result detected by the detecting step.

9. An exposure method using an exposure apparatus that comprises an optical system for radiating light from a light source onto an optical integrator, a condensing optical system for condensing light from the optical integrator to a specified plane, an imaging optical system for imaging the light in the specified plane onto a reticle or a mask or near the reticle or the mask, a projection optical system for projecting a pattern on the reticle or the mask onto an object to be exposed, and a beam splitting member that is provided between the condensing optical system and the specified plane and generates a split beam used as a detection beam for measuring illuminance on the object, wherein $18.3° \leq \theta \leq 36.4°$, $1.0 \leq |B| \leq 2.5$, $0.16 \leq NA2 \leq 0.23$ and $0.74 \leq NA3 \leq 0.9$ are met where θ is a first angle formed between a beam splitting plane in the beam splitting member and a plane perpendicular to an optical axis, B is the magnification of the imaging optical system, NA2 is a maximum numerical aperture at a light exit side of the imaging optical system, and NA3 is a maximum numerical aperture at a light exit side of the projection optical system, said method comprising the steps of:

adjusting the first angle within the angle of θ; and illuminating the reticle or the mask by using said exposure apparatus.

10. An exposure method according to claim 9, further comprising the steps of:

detecting a light amount of the beam split by the beam splitting member; and controlling a light amount of the light source based on a result detected by the detecting step.

11. A device fabricating method comprising the steps of:

exposing an object by using an exposure apparatus that comprises a condensing optical system for condensing light from a light source to a specified plane, an imaging optical system for imaging the light in the specified plane onto a reticle or a mask or near the reticle or mask, a projection optical system for projecting a pattern on the reticle or the mask onto the object, and a beam splitting member that is provided between the condensing optical system and the specified plane, and generates a split beam, wherein $18.3° \leq \theta \leq 36.40$, $1.0 \leq |B| \leq 2.5$ and $0.16 \leq NA2 \leq 0.23$ are met where θ is an angle formed between a splitting plane in the beam splitting member and a plane perpendicular to an optical axis, B is the magnification of the imaging optical system, and NA2 is a maximum numerical aperture at a light exit side of the imaging optical system; and performing a specified process for the exposed object.

12. A device fabricating method comprising the steps of:

exposing an object by using an exposure apparatus that comprises an optical system for radiating light from a light source onto an optical integrator, a condensing optical system for condensing light from the optical integrator to a specified plane, an imaging optical system for imaging the light in the specified plane onto a reticle or a mask or near the reticle or the mask, a projection optical system for projecting a pattern on the reticle or the mask onto the object, and a beam splitting member that is provided between the condensing optical system and the specified plane and generates a split beam used as a detection beam for measuring illuminance on the object, wherein $18.3° \leq \theta \leq 36.40$, $1.0 \leq |B| \leq 2.5$, $0.16 \leq NA2 \leq 0.23$ and $0.74 \leq NA3 \leq 0.9$ are met where θ is an angle formed between a beam splitting plane in the beam splitting member and a plane perpendicular to an optical axis, B is the predetermined magnification of the imaging optical system, NA2 is a maximum numerical aperture at a light exit side of the imaging optical system, and NA3 is a maximum numerical aperture at a light exit side of the projection optical system; and performing a specified process for the exposed object.

* * * * *